United States Patent
Yegnashankaran et al.

(10) Patent No.: US 6,946,321 B1
(45) Date of Patent: Sep. 20, 2005

(54) METHOD OF FORMING THE INTEGRATED CIRCUIT HAVING A DIE WITH HIGH Q INDUCTORS AND CAPACITORS ATTACHED TO A DIE WITH A CIRCUIT AS A FLIP CHIP

(75) Inventors: Visvamohan Yegnashankaran, Redwood City, CA (US); Gobi R. Padmanabhan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/853,875

(22) Filed: May 26, 2004

Related U.S. Application Data

(62) Division of application No. 10/010,343, filed on Dec. 5, 2001, now Pat. No. 6,781,239.

(51) Int. Cl.[7] .............................................. H01L 21/60
(52) U.S. Cl. ...................... 438/107; 438/108; 438/613; 438/617
(58) Field of Search ............................... 438/107, 108, 438/110, 612, 613, 617

(56) References Cited

U.S. PATENT DOCUMENTS

| 3,918,581 | A | 11/1975 | Scammon, Jr. et al. ...... 206/334 |
| 4,989,117 | A | 1/1991 | Hernandez ................... 361/306 |
| 5,103,289 | A | 4/1992 | Brady ........................... 357/72 |
| 6,101,371 | A * | 8/2000 | Barber et al. ................. 455/73 |
| 6,373,011 | B1 | 4/2002 | Beffa ............................ 209/573 |
| 6,376,904 | B1 | 4/2002 | Haba et al. .................. 257/686 |
| 6,399,416 | B1 | 6/2002 | Wark ........................... 438/106 |
| 6,401,545 | B1 | 6/2002 | Monk et al. .................. 73/756 |
| 6,555,200 | B2 | 4/2003 | Hashimoto .................. 428/136 |
| 6,600,231 | B2 | 7/2003 | Tominaga .................... 257/778 |
| 6,603,182 | B1 | 8/2003 | Low et al. .................... 257/432 |
| 6,630,725 | B1 * | 10/2003 | Kuo et al. .................... 257/659 |
| 6,781,239 | B1 | 8/2004 | Yegnashankaran et al. . 257/777 |
| 6,853,067 | B1 * | 2/2005 | Cohn et al. .................. 257/704 |
| 2002/0089044 | A1 * | 7/2002 | Simmons et al. ........... 257/668 |
| 2002/0096760 | A1 | 7/2002 | Simelgor et al. ........... 257/723 |

FOREIGN PATENT DOCUMENTS

| EP | 1093143 A1 | 4/2001 | .......... H01H 59/00 |
| JP | 35821830 A | 12/1983 | ........... H01L 21/60 |

OTHER PUBLICATIONS

*Stanley Wolf et al., "Silicon Processing for the VLSI Era", 2000, Lattice Press, vol. 1, Second Edition, pps. 826-829.
*Charles A. Harper, "Electronic Packaging and Interconnection Handbook", 1991, McGraw Hill, pps. 6.71-6.73.
C.H. Cheng et al., "Electrical Through-Wafer Interconnects With Sub-PicoFarad Parasitic Capitance", Microelectromechanical Systems Conference, IEEE, Aug. 2001, pps. 18-21.

* cited by examiner

Primary Examiner—Stephen W. Smoot
(74) Attorney, Agent, or Firm—Mark C. Pickering

(57) ABSTRACT

A semiconductor integrated circuit with high Q inductors and capacitors is disclosed. A semiconductor electrical circuit is formed on a first die, while micro-electromechanical structures having inductance and capacitance are formed on a second die. The second die is attached and electrically connected to the first die as a flip chip.

17 Claims, 3 Drawing Sheets

METHOD OF FORMING THE INTEGRATED CIRCUIT HAVING A DIE WITH HIGH Q INDUCTORS AND CAPACITORS ATTACHED TO A DIE WITH A CIRCUIT AS A FLIP CHIP

This is a divisional application of application Ser. No. 10/010,343 filed on Dec. 5, 2001, now U.S. Pat. No. 6,781,239 issued on Aug. 24, 2004.

BACKGROUND OF THE INVENTION

1. Field of the Invention

The present invention relates to integrated circuits and, more particularly, to an integrated circuit and method of forming the integrated circuit that has a die with high Q inductors and capacitors that is formed on a die with a circuit as a flip chip.

2. Description of the Related Art

Low-loss, linear inductors and capacitors are common circuit elements in radio frequency (RF) applications, such as digital cellular telephones. These devices tend to be quite large with respect to the digital circuitry, and are one of the limiting factors in further significant reductions in the size of digital cellular telephones.

For example, one important measure of an inductor is the quality factor or Q of the inductor. High Q inductors are desirable in a number of RF circuits, such as resonant circuits. The Q of an inductor is given by equation (EQ.) 1 as:

$$Q = \omega L/R, \qquad \text{EQ. 1}$$

where ω is related to the frequency f of the signal applied to the inductor ($\omega = 2(\pi)(f)$), L represents the inductance of the inductor, and R represents the resistance of the inductor.

As indicated by EQ. 1, the smaller the resistance, the higher the of the inductor. One common approach to reducing the resistance of an inductor is to increase the size of the inductor. In addition, capacitors, like inductors, have a similar Q measure which increases with increasing size. As a result, high Q inductors and capacitors are often implemented at the circuit board level as discrete components, requiring a significant amount of circuit board space.

One approach to providing an integrated circuit with high Q inductors and capacitors is to fabricate both the electrical circuit and the high Q inductors and capacitors on the same semiconductor substrate. This approach, however, typically suffers from a number of drawbacks, including induced substrate currents and relatively thick metal layers.

Another approach to providing an integrated circuit with high Q inductors and capacitors that address these drawbacks is the use of micro-electromechanical systems (MEMS) technology. For example, using MEMS technology, the functionality of a low loss inductor and capacitor can be provided by using micron-sized electromechanical structures.

Although techniques exist for providing an integrated circuit with high Q inductors and capacitors, there is a continuing need for alternate structures and methods of forming the structures.

SUMMARY OF THE INVENTION

The present invention provides an integrated circuit with a die that is attached to another die as a flip chip. The flip chip die has micro-electromechanical structures that realize high Q inductors and/or capacitors, while the other die has an electrical circuit that utilizes the high Q inductors and/or capacitors. The use of two dice in the integrated circuit simplifies the manufacturing process and increases manufacturing flexibility.

An integrated circuit in accordance with the present invention includes a first die that has a substrate with an electrical circuit, and an interconnect that is formed on the substrate and electrically connected to the electrical circuit. The first die also has a passivation layer that is formed on the interconnect, and a plurality of first bonding pads that are formed on the passivation layer. The first bonding pads are electrically connected to the interconnect. The first die further has a plurality of second bonding pads that are formed on the passivation layer. The second bonding pads are electrically connected to the interconnect.

The integrated circuit also includes a second die that has a micro-electromechanical structure which has an inductance, and a plurality of third bonding pads that are connected to the micro-electromechanical structure. The integrated circuit further includes a plurality of connectors that are attached and electrically connected to the second bonding pads and the third bonding pads.

The present invention also includes a method of forming the integrated circuit. The method includes the step of forming a first die from a first wafer. The first die has a substrate with an electrical circuit, and an interconnect that is formed on the substrate and electrically connected to the electrical circuit. The first die also has a passivation layer that is formed on the interconnect, and a plurality of first bonding pads that are formed on the passivation layer. The first bonding pads are electrically connected to the interconnect. The first die further has a plurality of second bonding pads that are formed on the passivation layer. The second bonding pads are electrically connected to the interconnect.

The method further includes the step of forming a second die from a second wafer. The second die has a micro-electromechanical structure which has an inductance, and a plurality of third bonding pads that are connected to the micro-electromechanical structure. In addition, the method includes the step of attaching the third bonding pads of the second die to the second bonding pads of the first die via a plurality of connectors.

In further accordance with the method of the present invention, the first die is fabricated at a first facility using a first sequence of fabrication steps, while the second die is fabricated using a different second sequence of fabrication steps at either the first facility or a second facility. Further, the third bonding pads of the second die can be attached to the second bonding pads of the first die at the first facility, the second facility, or a third facility.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
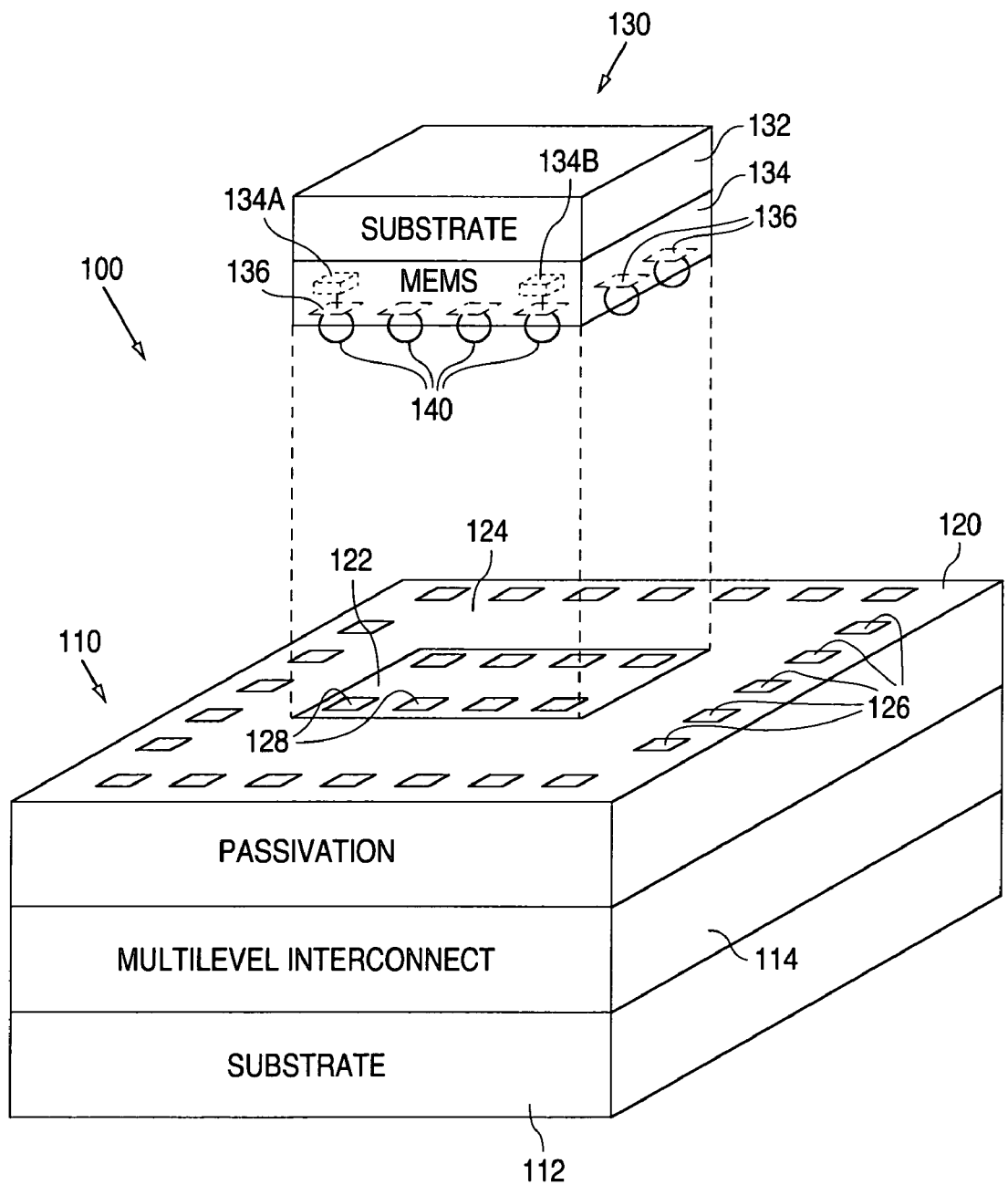
FIG. 1 is an exploded perspective view illustrating an integrated circuit structure 100 in accordance with the present invention.

FIG. 1 shows an exploded perspective view that illustrates an integrated circuit structure 100 in accordance with the present invention. As described in greater detail below, an integrated circuit having high Q inductors and capacitors is formed by attaching a die which has micro-electromechanical structures that realize high Q inductors and/or capacitors to a die that has an electrical circuit as a flip chip.

As shown in FIG. 1, structure 100 includes a first die 110 and a second die 130. First die 110, in turn, includes a first semiconductor substrate 112 that has an electrical circuit. The electrical circuit can be implemented with a bipolar, CMOS, or BiCMOS circuit that requires or can benefit from a high Q inductor and/or a high Q capacitor. As noted above, high Q inductors and capacitors are commonly utilized in RF circuits, such as resonant circuits.

As further shown in FIG. 1, first die 110 includes a multilevel metal interconnect 114 that is formed on substrate 112 to be electrically connected to the electrical circuit. In addition, first die 110 has a layer of passivation material 120 that is formed over metal interconnect 114. The top surface of the layer of passivation material 120 has an inner surface region 122 and a peripheral surface region 124 that encircles inner surface region 122.

First die 110 also includes a number of circuit bonding pads 126 in peripheral surface region 124 that are formed on passivation layer 120, and connected to the electrical circuit via metal interconnect 114. Circuit bonding pads 126 provide connection points for power and ground along with various electrical signals. In addition, first die 110 includes a number of inner bonding pads 128 in inner surface region 122 that are formed on passivation layer 120, and connected to the electrical circuit via metal interconnect 114.

Second die 130 includes a second semiconductor substrate 132, and a micro-electromechanical block 134 that is formed on second substrate 132. Micro-electromechanical block 134, in turn, includes inductive structures, such as inductive structure 134A, that realize the functionality of a high Q inductor, and/or capacitive structures, such as capacitive structure 134B, that realize the functionality of a high Q capacitor.

The inductive structures of block 134 can be implemented with fixed values of inductance, or as structures with a variable inductance. In addition, the inductive structures of the present invention can be implemented with prior-art, MEMS-based semiconductor structures that are utilized to realize high Q inductors.

Similarly, the capacitive structures of block 134 can be implemented with fixed values of capacitance, or as structures with a variable capacitance. In addition, the capacitive structures of the present invention can be implemented with prior-art, MEMS-based semiconductor structures that are utilized to realize high Q capacitors.

Further, die 130 has MEMS bonding pads 136 that are electrically connected to the inductive and/or capacitive structures. In addition, the integrated circuit also has solder balls 140 that are connected to the MEMS bonding pads 136. In accordance with the present invention, die 130 is attached to die 110 as a flip chip such that inner bonding pads 128 are electrically connected to MEMS bonding pads 136 via solder balls 140.

The MEMS bonding pads 136 and solder balls 140 are formed using prior-art materials and methods, such as the materials and methods used to form prior-art flip chip structures. In addition, second die 130 has a footprint that is the same size as, or smaller than, the size of inner surface region 122 of passivation layer 120. In the example shown in FIG. 1, the footprint is the same size as inner surface region 122.

Figure 2:
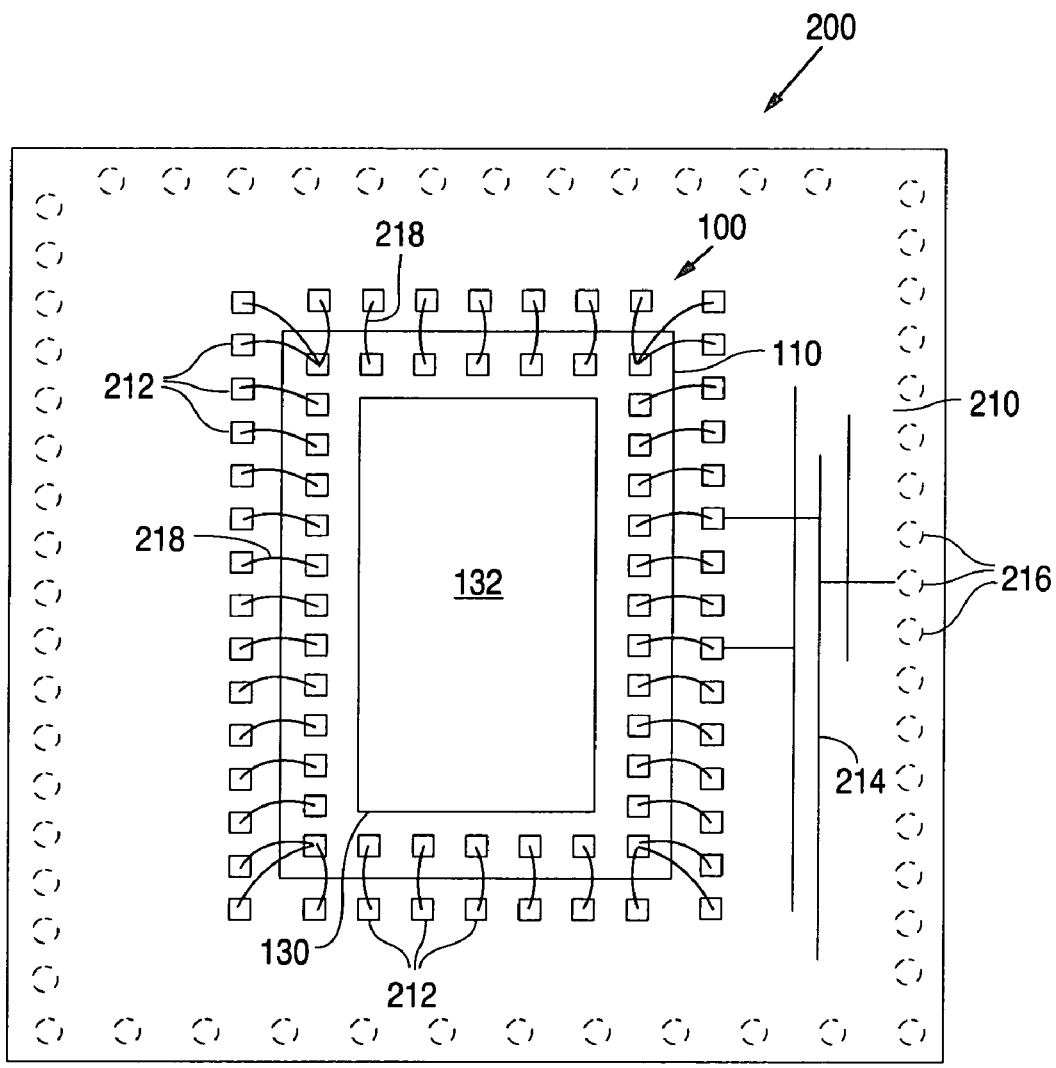
FIG. 2 is a plan view illustrating an integrated circuit package 200 in accordance with the present invention.

FIG. 2 shows a plan view that illustrates an integrated circuit package 200 in accordance with the present invention. As shown in FIG. 2, integrated circuit package 200 includes a multi-layered substrate 210 and integrated circuit structure 100 which is attached to substrate 210.

Multi-layered substrate 210, in turn, includes a number of package bonding pads 212, and internal routing 214 that is electrically connected to the package bonding pads 212. In addition, substrate 210 also includes a number of solder bumps 216 (or pins) that are extend away from the bottom side of package 200, and connected to internal routing 214. Further, package 200 includes a number of very fine bonding wires 218 that provide an electrical connection between the circuit bonding pads 126 and the package bonding pads 212.

Figures 3, 4:
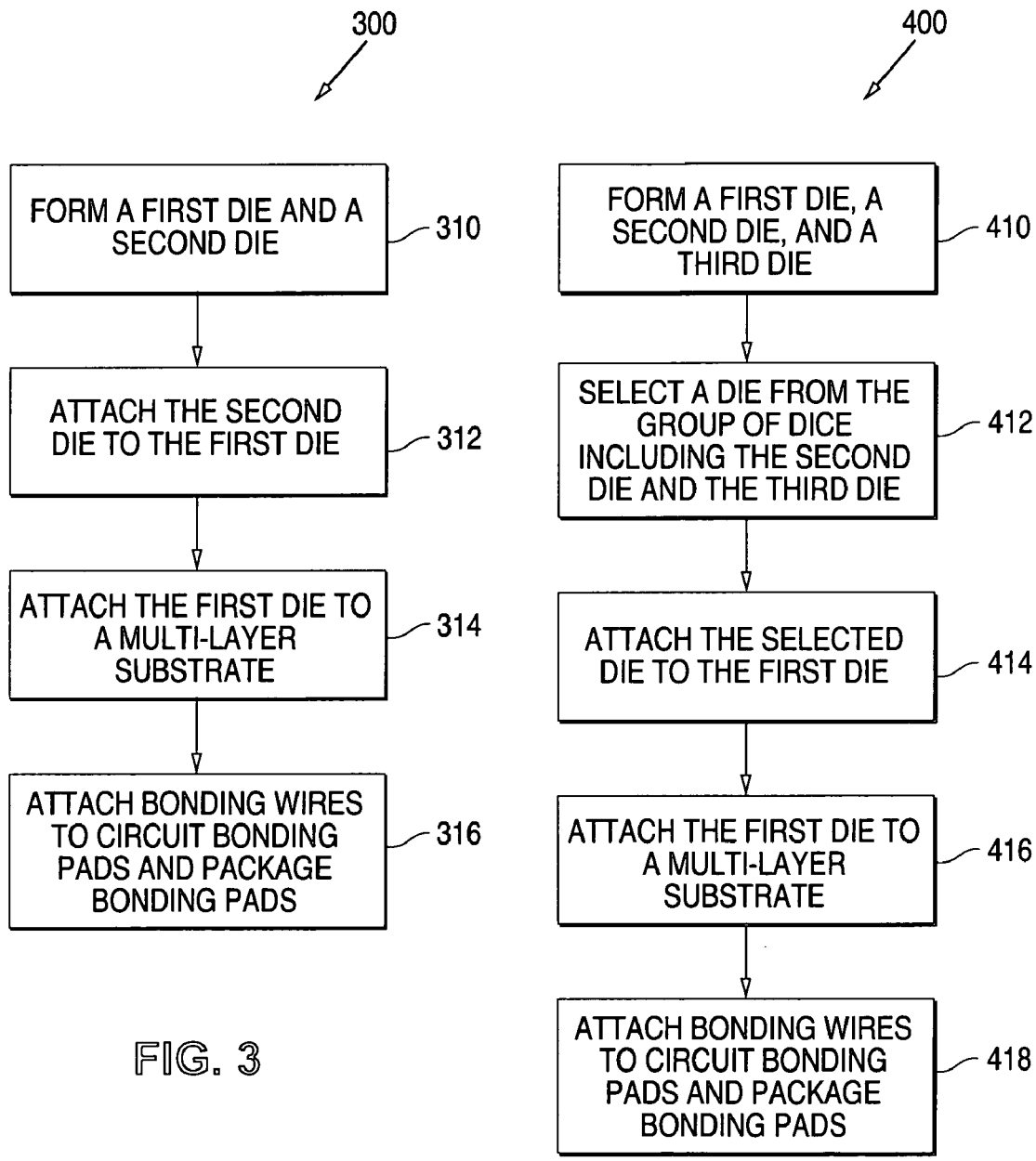
FIG. 3 is a flow chart illustrating a method 300 of forming an integrated circuit package, such as package 200, in accordance the present invention.
FIG. 4 is a flow chart illustrating a method 400 of forming an integrated circuit package, such as package 200, in accordance with an alternate embodiment of the present invention.

FIG. 3 shows a flow chart that illustrates a method 300 of forming an integrated circuit package, such as package 200, in accordance the present invention. As shown in FIG. 3, method 300 begins with step 310 by forming a first die and a second die, such as first die 110 and second die 130. The first die and the second die are formed from different wafers and, like first die 110 and second die 130, have bonding pads.

In the present invention, the wafer that includes the first die and the wafer that includes the second die can be fabricated at the same manufacturing facility or at different manufacturing facilities, and can be formed at the same time or at different times. In addition, the first die is fabricated using a first sequence of prior-art fabrication steps, while the second die is fabricated using a different second sequence of prior-art fabrication steps.

Following this, method 300 moves to step 312 where the bonding pads of the second die, such as bonding pads 136 of second die 130, are attached to the bonding pads of the first die, such as bonding pads 128 of first die 110, via a number of solder balls, such as solder balls 140. The second die can be attached to the first die at the facility or facilities that fabricated the first die, the facility or facilities that fabricated the second die, or at a third facility.

After the second die has been attached to the first die, method 300 moves to step 314 where the first die is attached to a multi-layer substrate, such as multi-layer substrate 210, that has bonding pads. The first die is connected to the multi-layer substrate using conventional back-end processing steps.

Further, the first die can be attached to the multi-layer substrate at the facility or facilities that fabricated the first die, the facility or facilities that fabricated the second die, the facility where the second die was attached to the first die or at a fourth facility.

Following this, method 300 moves to step 316 where very fine bonding wires, such as wires 218, are connected to the bonding pads of the first die, such as the circuit bonding pads 126, and the bonding pads of the package, such as the package bonding pads 212. The bonding wires are connected to the bonding pads of the first die and the bonding pads of the package using conventional materials and methods.

Once the bonding wires have been formed, method 300 continues with conventional back-end processing steps. Further, the first die can be attached to the multi-layer substrate at the facility or facilities that fabricated the first die, the facility or facilities that fabricated the second die, the facility where the second die was attached to the first die, the facility where the first die was attached to the multi-layered substrate, or at a fifth facility.

One of the advantages of the present invention is that the present invention greatly simplifies the manufacturing process. Since die 110 and die 130 are independently formed, the electrical circuit formed on substrate 112 can continue to be formed using conventional bipolar, CMOS, or BiCMOS processes without the need to modify the fabrication sequence to incorporate the steps required to form integrated MEMS structures. Further, many micro-electromechanical structures are simple to fabricate as discrete devices.

In addition to simplifying the process, the present invention is also independent of the geometry of the fabrication technology that is used. For example, as long as the footprint of die 130 is the same size or smaller than inner surface region 122, and the inner bonding pads 128 are aligned with the MEMS bonding pads 136, die 130 can be used with die 110 regardless of whether die 110 utilizes a 0.35-micron, a 0.25-micron process, a 0.18-micron, or a 0.13-micron process.

Further, since each step of the manufacturing process (the formation of die 110 and die 130, the attachment of die 130 to die 110, the attachment of die 110 to substrate 210, and the attachment of the bonding wires) can be performed at different fabrication facilities, the present invention fosters manufacturing competition. For example, one company may be particularly cost effective in producing die 110, but cost ineffective in packaging structure 100. As a result, the lowest cost provider can be utilized at each step.

FIG. 4 shows a flow chart that illustrates a method 300 of forming an integrated circuit package, such as package 200, in accordance with an alternate embodiment of the present invention. As shown in FIG. 4, method 400 begins with step 410 by forming a first die, such as first die 110, a second die, such as second die 130, and a third die.

The first die, the second die, and the third die are formed from different wafers and, like first die 110 and second die 130, have bonding pads. In method 400, the second die and the third die are identical except that the inductive and capacitive values provided by the MEMS structures on the second die and the third die are different. For example, the inductive values can be different, the capacitive values can be different, or both the inductive and capacitive values can be different.

In method 400, as with method 300, the wafer that includes the first die, the wafer that includes the second die, and the wafer that includes the third die can be fabricated at the same facility or at different facilities. In addition, the wafers can be formed at the same time or at different times.

Following this, method 400 moves to step 412 where a selected die from the group including the second die and the third die is chosen. Next, method 400 moves to step 414 where the bonding pads, such as bonding pads 136, of the selected die are attached to the bonding pads, such as inner bonding pads 128, of the first die via a number solder balls, such as solder balls 140.

After the selected die has been attached to the first die, method 400 moves to step 414 where the first die is attached to a multi-layer substrate, such as multi-layer substrate 210. The first die is connected to the multi-layer substrate using conventional back-end processing steps.

Following this, method 400 moves to step 416 where very fine bonding wires, such as wires 218, are connected to the bonding pads, such as pads 126, of the first die and the bonding pads, such as pads 212, of the package. The bonding wires are connected to the bonding pads of the first die and the bonding pads of the package using conventional materials and methods.

Once the bonding wires have been formed, method 400 continues with conventional back-end processing steps. In method 400, as with method 300, each step of the manufacturing process (the formation of the dice, the attachment of the selected die to the first die, the attachment of the first die to the multi-layer substrate, and the attachment of the bonding wires) can be performed at different fabrication facilities. Thus, as with method 300, method 400 allows the lowest cost provider to be utilized at each step.

One of the advantages of method 400 is that method 400 increases manufacturing flexibility. By utilizing dice with different inductances and capacitances, the present invention allows the electrical circuit formed on first die 110 to be combined with one of several different inductance and capacitance values to provide one of several different circuit response capabilities.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of forming an integrated circuit, the method comprising the steps of:
    forming a first die from a first wafer, the first die having:
        a substrate with an electrical circuit;
        an interconnect formed on the substrate and electrically connected to the electrical circuit;
        a passivation layer formed on the interconnect;
        a plurality of first bonding pads formed on the passivation layer, the first bonding pads being electrically connected to the interconnect; and
        a plurality of second bonding pads formed on the passivation layer, the second bonding pads being electrically connected to the interconnect;
    forming a second die from a second wafer, the second die having:
        a micro-electromechanical structure having an inductance; and
        a plurality of third bonding pads, the micro-electromechanical structure being connected to a third bonding pad; and
    attaching the third bonding pads of the second die to the second bonding pads of the first die.

2. The method of claim 1 wherein the first die is fabricated at a first facility using a first sequence of fabrication steps and the second die is fabricated at a second facility using a different second sequence of fabrication steps.

3. The method of claim 2 wherein the third bonding pads of the second die are attached to the second bonding pads of the first die at the first facility.

4. The method of claim 2 wherein the third bonding pads of the second die are attached to the second bonding pads of the first die at the second facility.

5. The method of claim 1 wherein the first die is fabricated at a facility using a first sequence of fabrication steps and the second die is fabricated at the facility using a different second sequence of fabrication steps.

6. The method of claim 1 wherein the third bonding pads of the second die are attached to the second bonding pads of the first die at a third facility.

7. The method of claim 1 and further comprising the step of attaching the first die to a semiconductor package, the semiconductor package having a plurality of fourth bonding pads, a plurality of circuit board connectors, and internal routing that electrically connects the plurality of fourth bonding pads to the plurality of circuit board connectors.

8. The method of claim 7 wherein the first die is fabricated at a first facility using a first sequence of fabrication steps, the second die is fabricated at a second facility using a different second sequence of fabrication steps, the third bonding pads of the second die are attached to the second bonding pads of the first die at a third facility, and the first die is attached to the semiconductor package at the third facility.

9. The method of claim 7 wherein the first die is fabricated at a first facility using a first sequence of fabrication steps, the second die is fabricated at a second facility using a different second sequence of fabrication steps, the third bonding pads of the second die are attached to the second bonding pads of the first die at a third facility, and the first die is attached to the semiconductor package at a fourth facility.

10. The method of claim 7 wherein the first die is fabricated at a first facility using a first sequence of fabrication steps, the second die is fabricated at a second facility using a different second sequence of fabrication steps, the third bonding pads of the second die are attached to the second bonding pads of the first die at the first facility, and the first die is attached to the semiconductor package at the first facility.

11. The method of claim 7 wherein the first die is fabricated at a first facility using a first sequence of fabrication steps, the second die is fabricated at a second facility using a different second sequence of fabrication steps, the third bonding pads of the second die are attached to the second bonding pads of the first die at the second facility, and the first die is attached to the semiconductor package at the second facility.

12. The method of claim 7 wherein the first die is fabricated at a facility using a first sequence of fabrication steps, the second die is fabricated at the facility using a different second sequence of fabrication steps, the third bonding pads of the second die are attached to the second bonding pads of the first die at the facility, and the first die is attached to the semiconductor package at the facility.

13. The method of claim 7 wherein the first die is fabricated at a first facility using a first sequence of fabrication steps, the second die is fabricated at the first facility using a different second sequence of fabrication steps, the third bonding pads of the second die are attached to the second bonding pads of the first die at a second facility, and the first die is attached to the semiconductor package at the second facility.

14. The method of claim 7 wherein the first die is fabricated at a first facility using a first sequence of fabrication steps, the second die is fabricated at the first facility using a different second sequence of fabrication steps, the third bonding pads of the second die are attached to the second bonding pads of the first die at a second facility, and the first die is attached to the semiconductor package at a third facility.

15. The method of claim 7 and further comprising the step of attaching a plurality of conductive wires to the plurality of first bonding pads and the plurality of fourth bonding pads.

16. The method of claim 15 wherein the first die is fabricated at a first facility using a first sequence of fabrication steps, the second die is fabricated at a second facility using a different second sequence of fabrication steps, the third bonding pads of the second die are attached to the second bonding pads of the first die at a third facility, the first die is attached to the semiconductor package at a fourth facility, and the plurality of conductive wires are attached in the fourth facility.

17. The method of claim 1 wherein the second die further includes a micro-electromechanical structure that has a capacitance, the micro-electromechanical structure having the capacitance being connected to a third bonding pad.

* * * * *

UNITED STATES PATENT AND TRADEMARK OFFICE
CERTIFICATE OF CORRECTION

PATENT NO. : 6,946,321 B1
DATED : September 20, 2005
INVENTOR(S) : Yegnashankaran et al.

It is certified that error appears in the above-identified patent and that said Letters Patent is hereby corrected as shown below:

Title page,
Item [56], References Cited, OTHER PUBLICATIONS,
"C.H. Cheng et al." reference, delete "Capitance" and replace with -- Capacitance --.

Column 1,
Line 36, after "higher the" insert -- Q --.

Signed and Sealed this

Sixth Day of December, 2005

JON W. DUDAS
*Director of the United States Patent and Trademark Office*